US009628098B2

United States Patent
Vitali

(10) Patent No.: US 9,628,098 B2
(45) Date of Patent: Apr. 18, 2017

(54) MULTICHANNEL TRANSDUCER DEVICES AND METHODS OF OPERATION THEREOF

(71) Applicant: STMICROELECTRONICS S.R.L., Agrate Brianza (IT)

(72) Inventor: Andrea Lorenzo Vitali, Santa Clara, CA (US)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 52 days.

(21) Appl. No.: 14/640,682

(22) Filed: Mar. 6, 2015

(65) Prior Publication Data

US 2015/0280648 A1     Oct. 1, 2015

Related U.S. Application Data

(60) Provisional application No. 61/972,194, filed on Mar. 28, 2014.

(51) Int. Cl.
*G06G 7/12*     (2006.01)
*G06G 7/16*     (2006.01)
(Continued)

(52) U.S. Cl.
CPC ............... *H03M 1/12* (2013.01); *G01D 3/024* (2013.01); *H03M 1/1205* (2013.01);
(Continued)

(58) Field of Classification Search
CPC .......... G06G 7/12; G06G 7/14; H03D 7/1441; H03D 7/1458; H03D 7/16; H03D 7/165;
(Continued)

(56) References Cited

U.S. PATENT DOCUMENTS 6,934,641 B2 *   8/2005   Chapman ............. G01D 5/2451
                                                                 702/33
2009/0002530 A1   1/2009   Arai et al.
(Continued)

FOREIGN PATENT DOCUMENTS

JP     2014-232092 A    12/2014
WO    2009/143434 A2    11/2009
WO    2013/108077 A1     7/2013

*Primary Examiner* — Lincoln Donovan
*Assistant Examiner* — Diana J Cheng
(74) *Attorney, Agent, or Firm* — SEED INTELLECTUAL PROPERTY LAW GROUP LLP

(57) ABSTRACT

The present disclosure is directed to multichannel transducer devices and methods of operation thereof. One example device includes at least two acquisition modules that have different sensitives and a signal processing stage that generates a blended signal representative of a lower gain signal mapped onto a higher gain signal. One example method of operation includes receiving a first signal from a first sensor having a first sensitivity, receiving a second signal from a second sensor having a second sensitivity that is different from the first sensitivity, generating a blended signal by mapping the second signal to the first signal, outputting the first signal while the first signal is below a first threshold and above a second threshold, and outputting the blended signal when the first signal is above the first threshold and when the first signal is below the second threshold.

25 Claims, 10 Drawing Sheets

(51) Int. Cl.
*H03M 1/12* (2006.01)
*G01D 3/024* (2006.01)
*H04N 5/235* (2006.01)
*H04R 3/00* (2006.01)
*H04N 5/232* (2006.01)

(52) U.S. Cl.
CPC ....... *H04N 5/2355* (2013.01); *H04N 5/23258* (2013.01); *H04R 3/005* (2013.01); *H04S 2400/09* (2013.01)

(58) Field of Classification Search
CPC ...... H03M 1/12; H03M 1/1205; H04R 3/005; H04S 2400/00; H04S 2400/03; H04S 2400/05; H04S 2400/07
USPC .................................................. 327/355, 361
See application file for complete search history.

(56) References Cited

U.S. PATENT DOCUMENTS

| | | | |
|---|---|---|---|
| 2009/0309999 A1 | 12/2009 | Hirai et al. | |
| 2012/0300960 A1* | 11/2012 | Mackay | H04H 60/04 381/119 |
| 2014/0198922 A1* | 7/2014 | Mauger | A61N 1/36032 381/60 |

\* cited by examiner

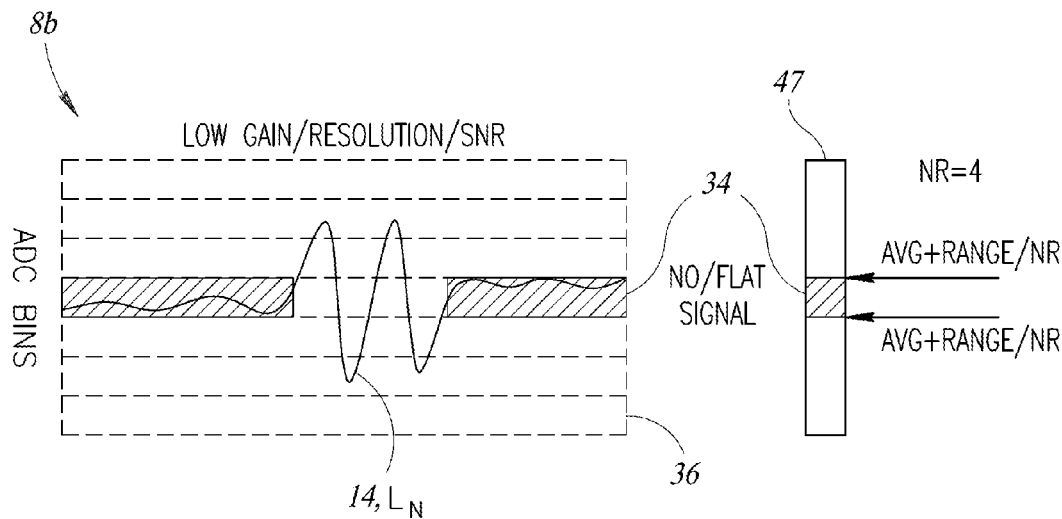
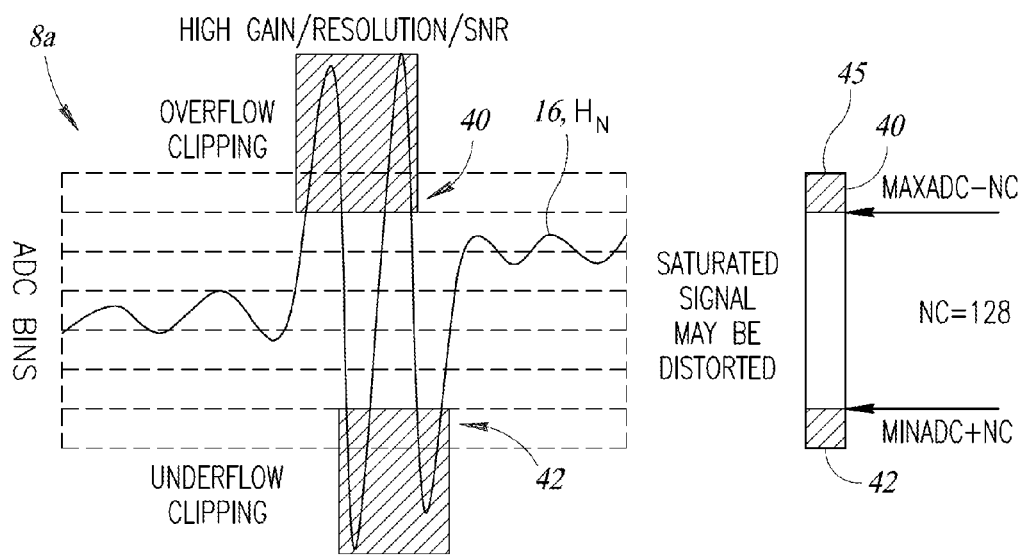
FIG.4A

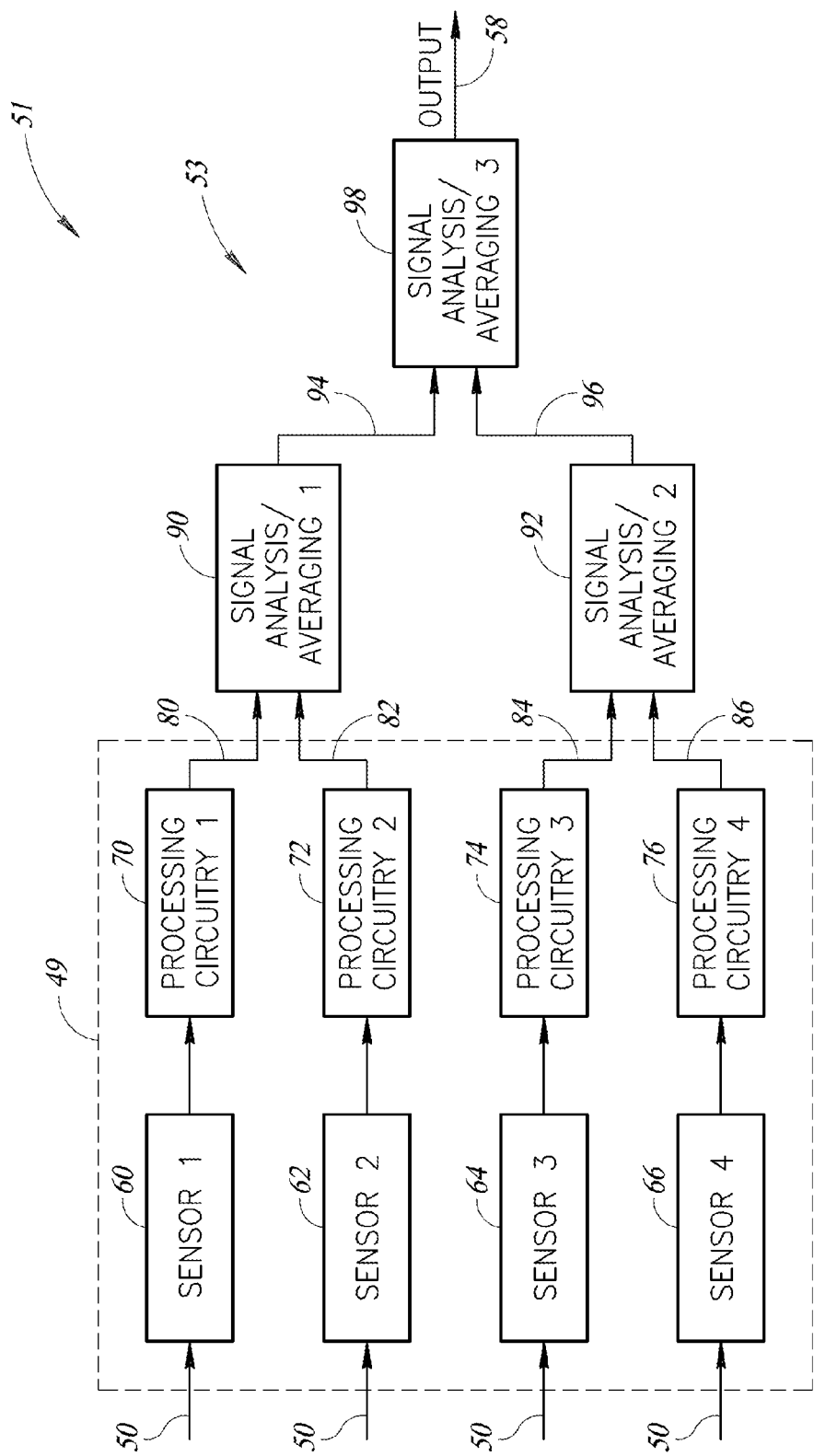

MULTICHANNEL TRANSDUCER DEVICES AND METHODS OF OPERATION THEREOF

BACKGROUND

Technical Field

The present disclosure is directed to multichannel transducer devices and, more particularly, multichannel transducer devices and methods of operation thereof that map a low gain signal onto a high gain signal to form a blended signal and that smoothly transition to the blended signal when the high gain signal saturates.

Description of the Related Art

Devices are becoming more sensitive and more precise about detecting or sensing the environment around them. In order to detect a high dynamic range of signals, these devices include multiple acquisition channels with different sensitivities (e.g., multiple sensors with different sensitivities). The range of a single acquisition channel is too limited to detect the full range of detectable signals.

Devices that include more than one acquisition channel, such as a low sensitivity acquisition channel and a high sensitivity acquisition channel, are becoming more common in everyday electronics. For example, cellular phones, game controllers, and other mobile devices incorporate microphones, gyroscopes, or other transducer-based devices (e.g., optical devices) that are configured to sense a wide range of incoming signals.

As an example, in order to sense this wide range of signals, a microphone may include multiple membranes or multiple microphones in a single package, where one has a low sensitivity and another has a high sensitivity. As another example, a single sensor (e.g., microphone membrane) with a relatively large sensitivity range may be provided as input to two different acquisition chains that respectively implement different amplification factors. Such may result in a device that appears to have two or more acquisition channels of different sensitivity.

Generally, the low sensitivity acquisition channel enables detection of strong portions of an environmental signal (high amplitude), but does not handle weak portions of the signal (low amplitude) well. The high sensitivity acquisition channel enables detection of the weak portions of the signal (low amplitude), but does not handle the strong portions of the signal well.

In current devices with multiple acquisition channels, a control circuit simultaneously acquires the output signals of different sensitivities from the two channels and adapts to the signal strength by directly switching between the high sensitivity and low sensitivity signals.

However, such switching creates unwanted discontinuities in the output signal. In particular, there may be a delay when switching between the high and low sensitivity signals. As another example, a discrepancy between noise floors respectively associated with the high and low sensitivity signals may be discernable when switching occurs (e.g., by a listener of an output signal switched between channels of a dual-channel microphone device). In addition, control circuits for the gain are often arranged away from the sensor in the chain of signal processing and fail to compensate for inherent limitations of the sensor.

BRIEF SUMMARY

The present disclosure is directed to multichannel transducer devices and methods of operation thereof that map a low gain signal onto a high gain signal to form a blended signal and that smoothly transition to the blended signal when the high gain signal saturates. The multichannel transducer device may have at least two acquisition modules of different sensitivity. The acquisition modules may detect, in parallel, an external force applied to the device and respectively output signals corresponding to the different sensitivities. The device processes at least two of the signals of different sensitivity to determine a plurality of mapping parameters. The device uses the mapping parameters to generate a blended signal representative of a lower sensitivity signal mapped to a higher sensitivity signal. The device outputs a weighted average of one or more of the acquired signals and the blended signal, with the weightings dependent, for example, upon operating mode and other factors. Because the blended signal is generated from the higher sensitivity signal, a transition from the higher sensitivity signal to the blended signal is smooth and without discontinuities.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

FIGS. 4A and 4B include graphical signal range representations of a low gain channel and a high gain channel, according to an example embodiment of the present disclosure;

FIG. 5 is a block diagram of a transducer assembly and a signal processing stage that performs parallel processing according to an example embodiment of the present disclosure;

DETAILED DESCRIPTION

Figure 1A:
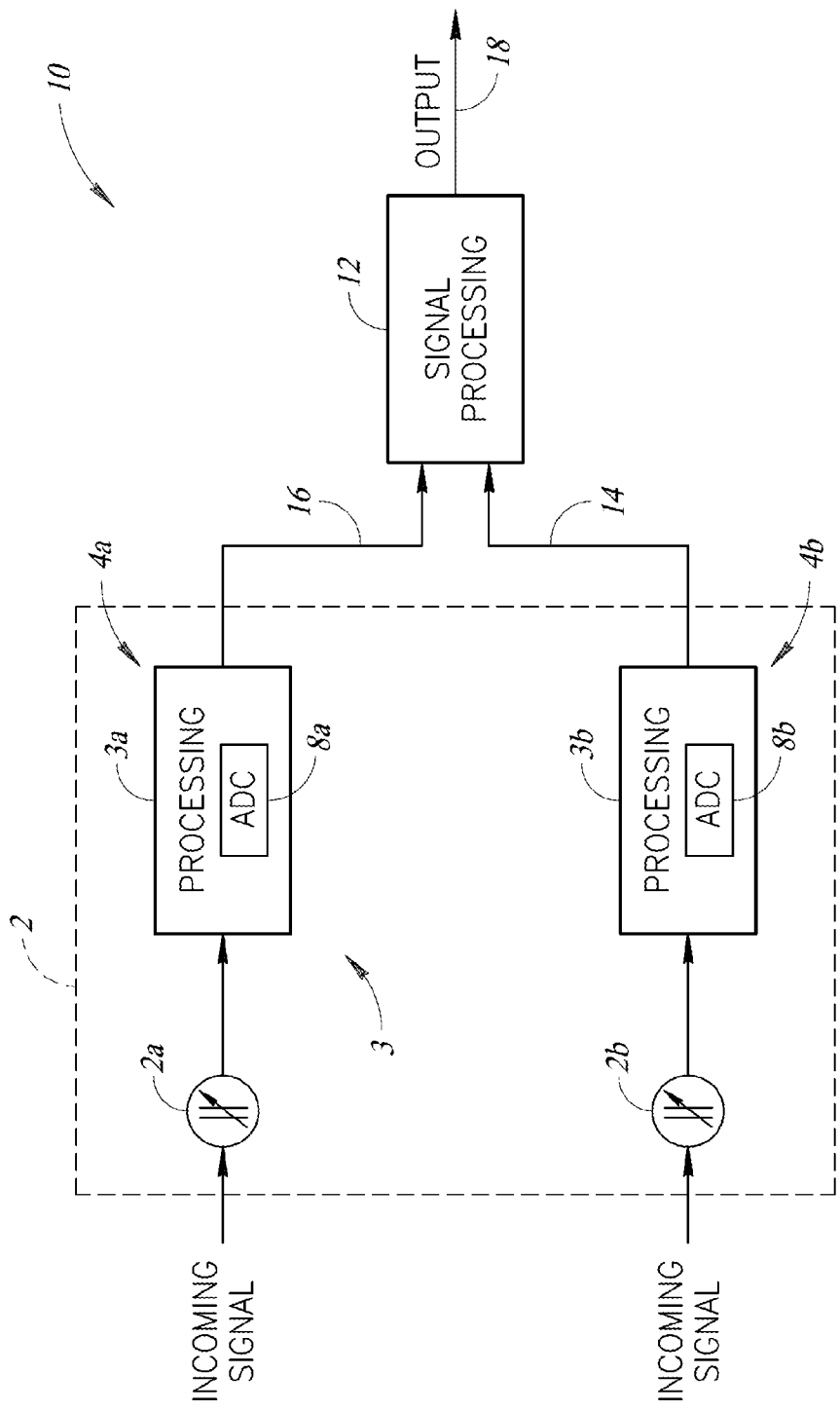
FIG. 1A is a block diagram of a true dual-channel transducer assembly and a signal processing stage of a device according to an example embodiment of the present disclosure.

In the following description, certain specific details are set forth in order to provide a thorough understanding of various embodiments of the disclosure. However, one skilled in the art will understand that the disclosure may be practiced without these specific details. In other instances, well-known structures associated with electronic components and signal processing have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising" is synonymous with "including" and is inclusive or open-ended (i.e., does not exclude additional, unrecited elements or method acts).

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

In the drawings, identical reference numbers identify similar elements or acts. The size and relative positions of elements in the drawings are not necessarily drawn to scale.

FIG. 1A is a block diagram of a system 10 formed in accordance with an embodiment of the present disclosure. The system 10 is configured to provide a wide dynamic range of signals by simultaneously acquiring information from a plurality of transducers that have different sensitivities. The system 10 includes a transducer assembly 2 that is configured to output at least two channels: a high gain channel 16 and a low gain channel 14. The transducer assembly may be any device having multiple simultaneously acquired signals, such as a device for optical detection with image stabilization, inertial sensing devices, such as dual core gyroscopes having a variable offset in time and accelerometers with dual core tracking and orientation, dynamic microphones, and other MEMS (micro-electromechanical systems).

The transducer assembly 2 in FIG. 1A includes two capacitive sensors 2a, 2b, where a first sensor 2a detects weak portions of signals from the environment, such as portions of signals having a low amplitude, and a second sensor 2b detects strong portions of signals from the environment, such as portions of signals having a high amplitude. As the transducer assembly 2 actually includes two different sensors 2a and 2b with different sensitivities, transducer assembly 2 may be denominated as a "true" dual-channel transducer assembly.

Due to the different sensitivities, different amplification factors can be applied to signals outputted by the capacitive sensors 2a, 2b. However, in some implementations, the same amplification factor is respectively applied to the signals outputted by the sensors 2a, 2b.

These capacitive sensors 2a, 2b may be any one of a number of different types of capacitive sensors, such as two separate microphones in separate packages that have different sensitivities, a microphone having two membranes included in a single package, or two optical sensors or two gyroscopes in a single package or in separate packages. The sensors 2a, 2b are configured to have different sensitivities that receive and output signals in parallel, acquiring the signals simultaneously.

The sensors 2a, 2b detect the same signal from the environment, but are processed simultaneously with two different acquisition chains. For example, the sensors detect the same acceleration, but with different accuracy or dynamic range. Alternatively, the sensors are microphones that detect the same sound with a different sensitivity or dynamic range.

Each sensor is coupled to a respective processing stage 3a and 3b (collectively indicated as 3), which are respectively configured to receive a detection quantity from the corresponding sensor 2a, 2b and output an electrical detection signal indicative of an input to the sensor. The sensors may be digital or analog sensors. Both of the sensors receive the same analog signals. In some implementations, a different amplification factor is applied to an output of each sensor because of the differences in sensitivity between the sensors.

A combination of the first sensor 2a with a first processing stage 3a may be referred to as a first acquisition module 4a. A combination of the second sensor 2b with a second processing stage 3b may be referred to as a second acquisition module 4b. The first and second acquisition modules 4a, 4b are configured to operate in parallel to simultaneously obtain information about the environment in which the system 10 is operating.

In the embodiment illustrated in FIG. 1A, the first processing stage 3a is coupled to the first sensor 2a, the high sensitivity sensor, and is configured to output a high gain signal 16, which is also the high gain channel 16. The first processing stage 3a receives an analog signal from the first sensor, which will generally be low amplitude signals since the first sensor is configured to be highly sensitive. The first processing stage 3a will then process the low amplitude signals to output the high gain signal 16. The first processing stage 3a may include an analog-to-digital converter 8a and an amplifier (not shown).

Similarly, the second processing stage 3b is coupled to the second sensor 2b and is configured to output a low gain signal 14, which may be referred to as a low gain channel 14. The second sensor 2b is capable of detecting the strong portions of signals, which balances with the detection of the weak portions of signals by the first sensor 2a. Since the first sensor 2a is capable of detecting weak portions of signals, the first sensor struggles to detect strong portions of signals with accuracy and precision. To increase the dynamic range of the transducer assembly 2, the second sensor 2b is capable of detecting the strong portions of signals, but struggles to detect weak portions of signals with accuracy and precision. The second processing stage 3b applies a low gain to the strong portions of signals to output the low gain signal 14. The second processing stage 3b may include an analog-to-digital converter 8b and an amplifier (not shown).

In some implementations, the first and second processing stage 3a, 3b may include the same components, where the only difference is the amplification factor. In particular, each processing stage 3a, 3b may include the same analog-to-digital converter 8a, 8b. For example, both the of the converters may be 10-bit converters or 12-bit converters. Furthermore, in some implementations, the sensors 2a, 2b are digital sensors and do not require subsequent ADC conversion as shown in FIG. 1A.

In some implementations, both the first ADC 8a and the second ADC 8b are 12-bit, analog-to-digital converters. The first and second ADC 8a, 8b are configured to receive an analog signal from the sensors 2a, 2b and output a 12-bit digital signal.

The ADCs 8a, 8b sample the analog signal and provide a digital representation of an amplitude of the analog signal at each sample. Each sample is associated with determining the amplitude of a segment of the analog signal. The samples taken by the ADCs are equal sequential segments of the analog signal, where each sample is one segment. The ADC analyzes the segment of the analog signal and outputs a digital value representing the amplitude of the segment. The conversion involves quantization of the input signal.

A difference between the actual analog value and quantized digital value is called quantization error. The error is caused by rounding or truncation and is often modeled as a random signal referred to as quantization noise (QNoise). Aspects of an ADC include its bandwidth, the range of frequencies it can measure, its signal-to-noise ratio (SNR), and how accurately it can measure a signal relative to the noise. The number of bits used to represent the digital output determines a maximum SNR. This is because the minimum noise level is the quantization error.

The dynamic range of the ADC is limited by the ADC's resolution, the number of output levels or bins to which it can quantize a signal. Resolution is usually expressed in bits or volts. The resolution determines the magnitude of the quantization error and therefore determines the maximum possible average signal-to-noise ratio. The minimum change in the voltage required to change the output is called the least significant bit (LSB) voltage and a resolution of the ADC is equal to the LSB voltage.

In one embodiment, the first and the second ADC 8a, 8b are 12-bit converters. The maximum number of bins or quantization levels available for a 12-bit ADC is 4096 (i.e., $2^{12}=4095$ and bin zero through bin 4095 equals 4096 bins). Accordingly, the high gain channel 16 is a 12-bit signal and the low gain channel 14 is a 12-bit signal. Different ADC resolutions may be utilized as the end application dictates.

The system 10 further includes a signal processing stage 12 that receives the signals from the low gain channel 14 and the high gain channel 16. The signal processing stage 12 adjusts an output signal 18 to minimize discontinuities when the high gain channel 16 saturates or is clipped. In particular, the signal processing stage 12 generates a blended signal 32 that is representative of the low gain signal mapped onto the high gain signal. The signal processing stage 12 provides a weighted average of the blended signal 32 and the high gain signal as the output signal 18. Example structures and operations of the signal processing stage 12 will be discussed further with reference to FIGS. 2-8.

Figure 1B:
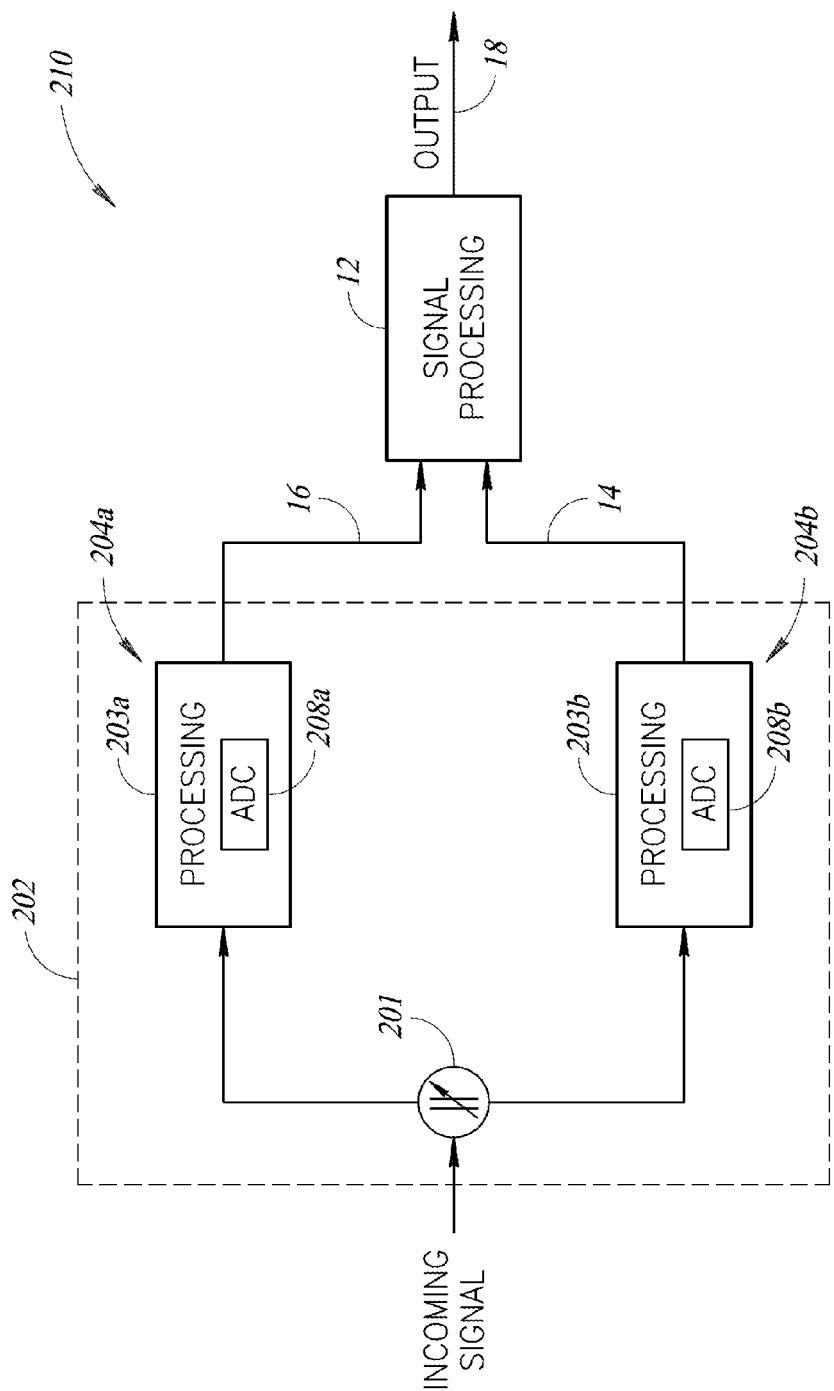
FIG. 1B is a block diagram of an apparent dual-channel transducer assembly and a signal processing stage of a device according to an example embodiment of the present disclosure.

FIG. 1B is a block diagram of a system 210 formed in accordance with an embodiment of the present disclosure. The system 210 is configured to provide at least two channels of signals with different sensitivities from a single sensor 201. The system 210 includes a transducer assembly 202 that is configured to output at least two channels, a high gain channel 16 and a low gain channel 14. The transducer assembly 202 may be any device that acquires a signal, such as a device for optical detection with image stabilization, inertial sensing device, microphone, and other MEMS (micro-electromechanical systems).

The transducer assembly 202 in FIG. 1B includes a single capacitive sensor 201 that has, for example, a relatively large signal sensitivity range. The capacitive sensor 201 may be any one of a number of different types of capacitive sensor, such as a microphone, a gyroscopic sensor, or an optical sensor.

The sensor 201 is coupled to two different processing stages 203a and 203b, which are respectively configured to receive a detection quantity from the sensor 201 and output an electrical detection signal indicative of an input to the sensor 201. The sensor 201 may be a digital or an analog sensor.

In the embodiment illustrated in FIG. 1B, the first processing stage 203a is coupled to the sensor 201 and is configured to output a high gain signal 16, which is also the high gain channel 16. The first processing stage 203a receives an analog signal from the sensor 201 and will then process the signal to output the high gain signal 16. The first processing stage 203a may include an analog-to-digital converter 208a and an amplifier (not shown). In particular, the amplifier of the first processing stage 203a will provide amplification of low amplitude portions of the signal from the sensor 201 to assist in generating the high gain signal 16.

Similarly, the second processing stage 203b is coupled to the sensor 201 and is configured to output a low gain signal 14, which may be referred to as a low gain channel 14. To increase the dynamic range of the transducer assembly 202 (i.e., provide at least two channels having different sensitivities), the second processing stage 203b applies a lower gain to the signal received from the sensor 201 than that applied by first processing stage 203a. The second processing stage 203b may include an analog-to-digital converter 208b and an amplifier (not shown). In other implementations, processing stage 203b does not include an amplification component at all.

A combination of the sensor 201 with the first processing stage 203a may be referred to as a first acquisition module 204a or first acquisition chain. A combination of the sensor 201 with the second processing stage 203b may be referred to as a second acquisition module 204b or second acquisition chain. The first and second acquisition modules 204a, 204b are configured to operate in parallel to simultaneously provide information about the environment in which the system 210 is operating. As the transducer assembly 202 includes a single sensor 201 but outputs two channels having different sensitivities, transducer assembly 202 may be denominated as an "apparent" dual-channel transducer assembly.

In some implementations, the first and second processing stage 203a, 203b may include the same components, where the only difference is the amplification factor (e.g., an amplification factor of an amplifier component included in processing stage 203a may be significantly larger than that of an amplifier component included in processing stage 203b). However, each processing stage 203a, 203b may include the same analog-to-digital converter 208a, 208b. For example, both the of the converters may be 10-bit converters or 12-bit converters. The system 10 includes the signal processing stage 12 that receives the signals from the low gain channel 14 and the high gain channel 16. The signal processing stage 12 shown in FIG. 1B is identical to signal processing stage 12 shown in FIG. 1A.

Furthermore, although FIGS. 1A and 1B illustrate dual channel transducer assemblies, the systems of the present disclosure can include transducer assemblies having any number of different sensitivity channels. For example, systems having four different channels of different sensitivity will be discussed with reference to FIGS. 5-7.

Referring again to FIG. 1A, due to limitations in the analog-to-digital conversion and the high gain applied by the first processing circuit 3a, any strong signal detected by the first sensor 2a can result in the processing circuit 3a saturating, clipping, or otherwise not outputting the full analog signal detected. Such saturation and clipping can also occur with respect to the high gain signal 16 output by the first acquisition module 204a of FIG. 1B.

Figure 3:
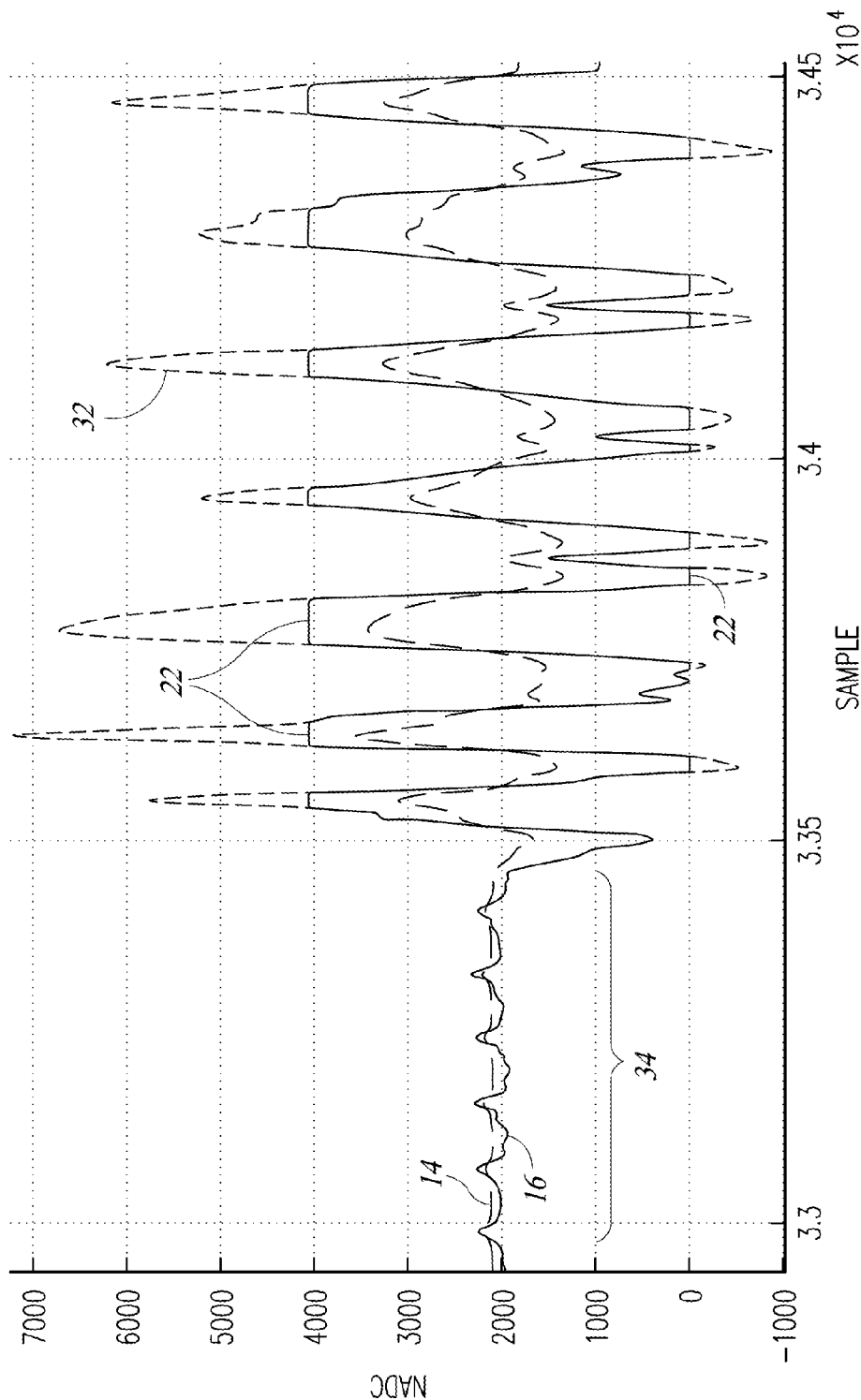
FIG. 3 is a graph including signals from a high gain channel, a low gain channel, and a blended signal formed in accordance with an example embodiment of the present disclosure.

As an example, FIG. 3 provides a graphical representation of the high gain signal 16, including areas 22 where the high gain signal 16 is clipped, i.e., the high gain signal 16 does not represent or otherwise output the full signal received by the high sensitivity acquisition module. The areas 22 represent an upper and lower threshold that correspond to upper and lower limits of the high gain signal's output, i.e., where the high gain signal will saturate.

The low gain signal 14 includes signal components that have higher amplitudes than what is captured and output on the high gain signal 16. Accordingly, the low gain signal 14 is not amplified much because the signal is already strong enough from the transducer. As seen in FIG. 3, the low gain signal 14 has a lower amplitude than the high gain signal and remains within the range between the upper and lower thresholds indicated by areas 22.

The low gain channel 14 is provided for low sensitivity detection and covers a wide dynamic range. Saturation is unlikely for low sensitivity acquisition modules. When the input signal to the transducers is only very low amplitude components, the first transducer 2a cannot detect the low amplitude components and thus, the low gain signal can appear flat, as shown for example, by the low gain channel 14 in area 34 in FIG. 3. One factor that is associated with the flat area 34 is the signal-to-noise ratio for low amplitude signals. As can be seen in FIG. 3, the high gain channel 16 is able to detect the variations in the low amplitude signals. The high gain channel 16 is provided for high sensitivity detection requiring larger amplification, which can result in clipping (see area 22).

However, switching directly between the low gain channel 14 and the high gain channel 16 can result in discernable delays or discontinuities in signal amplitude. For example, it the device switched directly from high gain signal 16 to the low gain signal 14 during areas 22, there would be a noticeable decrease in amplitude and other signal characteristics.

As such, according to an aspect of the present disclosure, the systems of the present disclosure can generate a blended signal 32. The blended signal 32 is representative of the low gain signal 14 mapped to the high gain signal 16. Switching between the high gain signal 16 and the blended signal 32 will not result in any discontinuities.

Referring again to FIG. 1A, in operation, the first and the second sensors 2a, 2b simultaneously receive inputs from the surrounding environment. The processing stages 3a, 3b simultaneously processes the signals from the first and second sensors 2a, 2b such that the signal processing stage 12 simultaneously acquires the signals from the high gain and the low gain channels 14, 16.

The inputs received by the sensors 2a, 2b may be constantly changing such that the signals on the high gain and low gain channels are quickly varying signals. The present disclosure is directed to a system and method for addressing the quick variation and outputting a smooth signal representative of the high dynamic range of the system 10.

Figure 2:
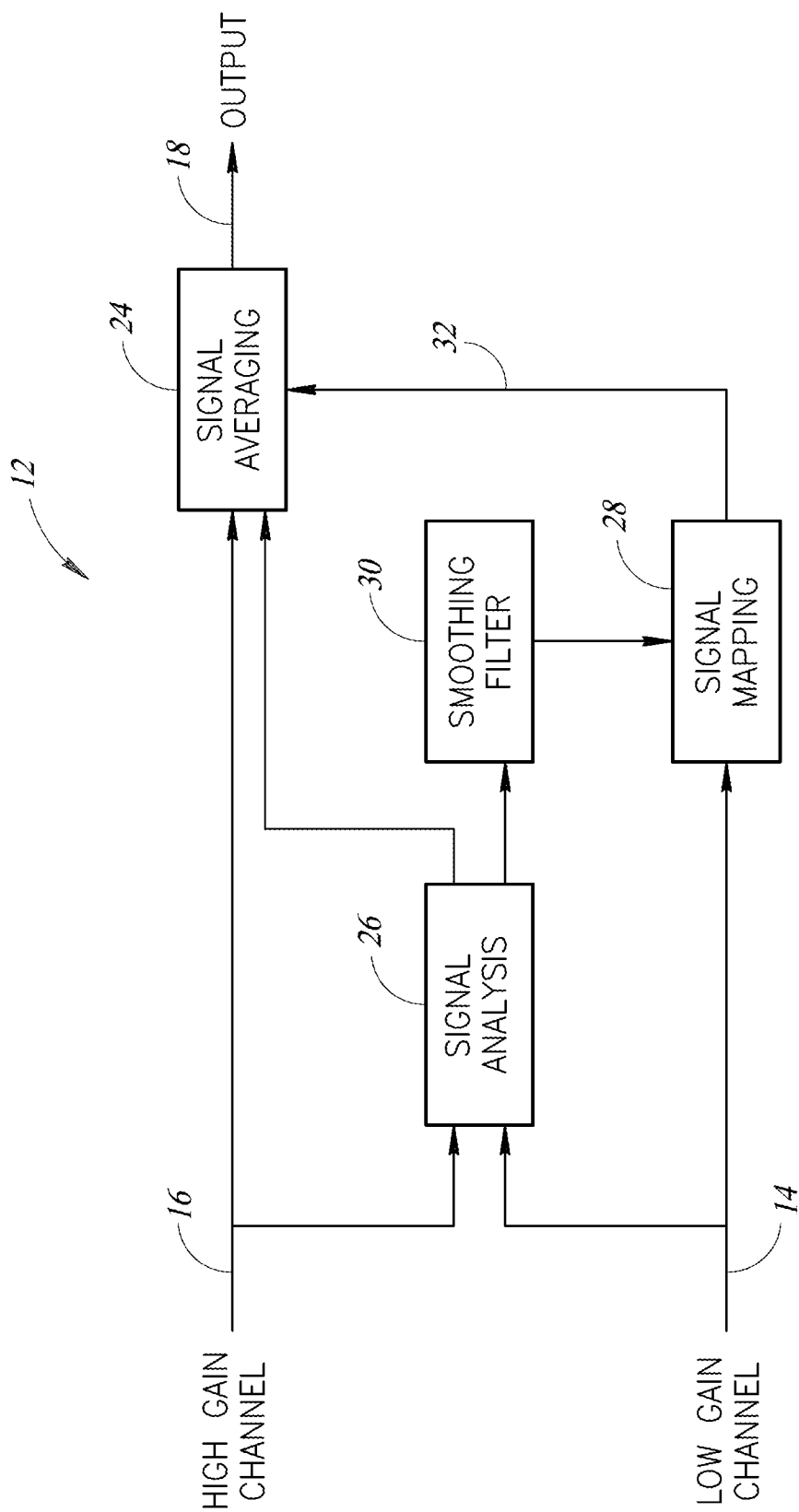
FIG. 2 is a block diagram of the signal processing stage of FIGS. 1A and 1B.

Referring now to FIG. 2, the signal processing stage 12 includes various components that analyze the low gain signal 14 and the high gain signal 16, generate the blended signal 32, and automatically determine and output a weighted average of the high gain signal 16 and the blended signal 32. In particular, the high gain signal 16 is provided to a signal averaging block 24 and to a signal analysis block 26. The low gain signal 14 is provided to the signal analysis block 26 and to a signal mapping block 28. The signal analysis block 26 outputs one or more signals to a smoothing filter 30, which is coupled to the signal mapping block 28. The blended output signal 32 of the signal mapping block 28 is provided as a second input to the signal averaging block 24. In some implementations, as shown in FIG. 2, one or more outputs of the signal analysis block 26 is provided to the signal averaging block 24. In yet other implementations, the output(s) of the smoothing filter 30 is provided to the signal averaging block 24 in addition or alternatively to the output(s) of signal analysis block 26.

The signal analysis block 26 analyzes the high gain signal 16 and the low gain signal 14 to determine a plurality of mapping parameters. For example, the plurality of mapping parameters may describe a linear relationship between the high gain signal 16 and low gain signal 14. The signal mapping block 28 uses the plurality of mapping parameters to map the low gain signal 14 to the high gain signal 16 and generate the blended signal 32. The signal averaging block 24 outputs a weighted average of the high gain signal 16 and the blended signal 32. The weightings used by the signal averaging block 24 can change over time (e.g., on a per-sample basis), with the weightings dependent, for example, upon operating mode, the mapping parameters, and/or other factors.

As noted above, aspects of the signal processing stage 12 may be implemented at a system level, above the circuit level, such as with software or an algorithm. The signal processing stage 12 provides high dynamic range sensing without the need for automatic gain control. This system is particularly advantageous for devices with optical detection with image stabilization, optical heart rate monitoring, inertial sensing devices having variable offset, dual core gyroscopes or accelerometers, or high dynamic range microphones. For example, dual core gyroscopes may have time varying offsets that can be addressed and output smoothly with the systems described in the present disclosure.

The systems of the present disclosure address issues from prior devices by automatically generating the blended signal 32 from the low gain signal 14 and the high gain signal 16. For example, in some implementations, the blended signal 32 is generated based on calibration samples taken from the low gain signal 14 and the high gain signal 16 after verification that the low gain signal is not flat and the high gain signal is not saturated. The verification may be performed in the signal processing stage 12, which may be implemented in software. Alternatively, the verification can be performed in one or more of the blocks. For example, the signal analysis block 26 can identify whether the high gain signal 16 is clipped or whether the low gain signal 14 is flat. This verification may also be performed in the signal averaging block 24 for the high gain signal 16 or in the signal mapping block 28 for the low gain signal.

Previous systems having a single signal sensitivity or acquisition channel did not allow for correct, complete detection of the signal, and control stages of the gain were often arranged too far down the signal processing chain to successfully compensate for the limitations of the single signal. One solution was to acquire two signals simultaneously and switch back and forth between the signals; however, the switching caused unwanted discontinuities detectable in the final output signal. To compound this problem, the discontinuities often worsened with time and age of the device.

In the previous systems, some solutions include providing automatic gain control and offset tracking, such as DC compensation. If the variations in the detected signal are too fast, these solutions may not work such that no signal is acquired or the signal is flat or clipped. The automatic gain control measures the intensity of the signal and then adapts based on the intensity of the signal; however, if the variation of the signal is too fast, then automatic gain control may not be able to keep up and the output will be flat or clipped. If the solution does work, the acquired signal may change over time, such as with amplitude modulation and baseline wandering.

In the systems of the present disclosure, the signal processing circuitry 12 is adapted to quickly and efficiently transition from the high gain signal 16 to the blended signal 32 with no disruptions in the output signal 18. Each of the components in the signal processing circuitry 12 work together to output the smooth output signal 18. The smoothing filter 30, which is optional, can be configured as a low pass filter to reject high speed variations of the signals. However, the smoothing filter 30 may be a band pass filter in other implementations. In particular, the smoothing filter can be any component that stabilizes the output of the signal analysis block 26. It could be linear or non-linear, i.e. it could have memory or hysteresis. The smoothing filter 30 may be fixed or tunable. The filter 30 may be an infinite impulse response (IIR) or a finite impulse response (FIR) filter. It may also be an IIR standard or IIR wave digital filter. In some implementations, the smoothing filter 30 can be implemented as regularization logic.

The signal averaging block 24 may have multiple modes for selection or combination of the high gain signal 16 versus the blended signal 32.

As an example, in some implementations, the signal averaging block 24 is configured to output the high gain signal 16 until the high gain signal saturates (e.g., provide a weighted average output signal 18 where the high gain signal 16 is weighted with a one value and the blended signal 32 is weighted with a zero value). When the high gain signal 16 saturates, the signal averaging block 24 will transition to output the blended output signal 32 (e.g., provide a weighted average output signal 18 where the high gain signal 16 is weighted with a zero value and the blended signal 32 is weighted with a one value), which allows the system to output the high amplitude signals that are above the threshold of the high gain signal 16. The transition from the high gain signal to the blended output signal 32 is a smooth transition with no clipping or distortion.

As another example, in some implementations, the signal averaging block 24 is configured to detect when the high gain signal 16 is trending towards the upper or lower threshold that is associated with clipping. As the high gain signal approaches the upper or lower threshold, the signal averaging block 24 switches the output from the high gain signal 16 to the blended signal 32. The signal averaging block 24 can quickly and smoothly transition from the high gain signal to the blended signal 32. For example, in some implementations the signal mapping block 28 constantly generates the blended signal 32. Therefore, the signal averaging block 24 constantly receives the blended signal 32 and can transition to such signal without discontinuities when desired.

In yet other implementations, when the signal averaging block 24 detects that the high gain signal 16 is trending towards the upper or lower threshold that is associated with clipping, the signal averaging block 24 can transition from the high gain signal 16 to the blended signal 32 over a series of stages, where the weightings applied to the high gain signal 16 decrease and the weightings applied to the blended signal 32 increase as the high gain signal 16 approaches the upper or lower threshold. Such may advantageously provide an even smoother transition from the high gain signal 16 to the blended signal 32.

In another example, the signal averaging block 24 will monitor whether the blended signal 32 is greater than or equal to the high gain signal 16. If the blended signal 32 is greater than or equal to the high gain signal 16 and/or the high gain signal 16 is clipped, the signal averaging block 24 will output the blended signal 32. Otherwise, the high gain signal 16 is output.

In another example, if the high gain signal 16 is not clipped and the low gain signal 14 is not flat, then the signal averaging block 24 will output a weighted average of the high gain signal 16 and the blended signal 32, where the weightings respectively applied to the signals 16 and 32 are each non-zero. The non-zero weightings may be selected from a discrete number of available weightings, selected from a spectrum of available weightings, or calculated based on various inputs or operating parameters.

As an example, the signal averaging block 24 may calculate the weightings applied to the signals 16 and 32 in such scenario based on the signal-to-noise ratio associated with such signals 16 and 32. The signal-to-noise ratio may be estimated based on the amplitude of the original high gain and low gain signals. However, if the high gain signal 16 is not clipped and/or the low gain signal 14 is flat, then the signal averaging block 24 will output the high gain signal 16.

Furthermore, according to an aspect of the present disclosure, in some implementations, the signal processing stage 12 operates on a per-sample basis. Thus, for each instance in which the first ADC 8a and the second ADC 8b output a new value (i.e., sample) for the high gain signal 16 and the low gain signal 14, respectively, the signal processing stage 12 can recalculate or otherwise reassess the available factors or parameters to re-determine the mapping parameters and re-generate the blended signal 32 and the weighted average output signal 18. However, in other implementations, certain portions of the signal processing stage 12 such as, for example, signal averaging block 24 may operate on a per-sample basis, while other portions of the signal processing stage 12 such as, for example, signal analysis block 26 and/or signal mapping block 28 may operate at a sampling interval of N calibration samples, where N is an integer greater than one. Such may be particularly true when the system is well conditioned.

One feature of the signal analysis block 26 is a least squares optimization module that is configured to determine a plurality of mapping parameters (K(0), K(1), . . . K(M)). The number of mapping parameters will be referred to as M+1. The mapping parameters are detected from the high and low gain signals 16 and 14 using least squares optimization.

In particular, the signal analysis block 26 can determine the mapping parameters based on a plurality of calibration samples of the high gain signal 16 and the low gain signal 14. One example process for selecting calibration samples will be discussed further below with reference to FIGS. 4A and 4B. One example process for determining the mapping parameters based on the calibration samples will be discussed further below with reference to FIG. 8.

The determined mapping parameters are then utilized by the signal mapping block 28 to generate the blended signal 32.

The mapping parameters may be generated or detected for each sample of the high gain channel 16 and the low gain channel 14, as discussed above, or may be determined for a number of calibration samples N. The number of mapping parameters M+1 will be less than or equal to a number of calibration samples, N, used to determine the mapping parameters. For example, in some implementations, the mapping parameters include two parameters: gain and offset, such that M=1 with K(0)=offset and K(1)=gain.

More particularly, the mapping parameters may be viewed as coefficients representing the linear relationship between the high gain signal and the low gain signal. For example, a first coefficient K(0) may be offset, a second coefficient K(1) may be gain, and a third coefficient K(2) may be signal power. The number of coefficients or mapping parameters may vary depending on the information pulled from the original signals and system design.

More generally, the linear relationship between the high gain signal and the low gain signal may be represented generally by the following formula:

$$H = \Sigma_0^M L^m K(m) \tag{1}$$

For the particular case where M=1, the linear relationship between the high gain signal and the low gain signal may be represented as follows:

$$H = L^0 K(0) + L^1 K(1) = K(0) + L^1 K(1) \tag{2}$$

Generally, the coefficient K(0) may be referred to as "offset" while the coefficient K(1) may be referred to as "gain." Therefore, one example application of equation 2 may be expressed as follows:

$$H = = L * \text{Gain} + \text{Offset} \tag{3}$$

This is a simple representation of the linear relationship where the high gain signal is approximately the low gain signal multiplied by the gain plus the offset; however, more complex relationships can be extracted from the signals based on the complexity of the system. Extraction of more complex relationships may result in a number of mapping parameters (M+1) that is greater than two. The systems and methods of the present disclosure can be advantageously applied to any number of mapping parameters (M+1).

FIG. 4A includes representations of analog signals in the first ADC 8a (see lower graph) and the second ADC 8b (see the upper graph). The high gain signal will be referred to as $H_n$ and the low gain signal will be referred to as $L_n$ below. The signal analysis block 26 receives and processes the 12-bit high gain signal 16 and the low gain signal 14 at all times. Accordingly, the system is never blind or prevented from outputting the output signal 18. However, the signal analysis block 26 only selects calibration samples when the low gain signal is not flat and the high gain signal is not clipped (e.g., the signals 16 and 14 are concurrently present in and overlapping resolution zone), as will be discussed further below.

As shown in FIG. 4A, both the high gain ADC 8a and the low gain ADC 8b have a number of bins or quantization levels that correspond to the digital output value for each sample of the analog signal. FIG. 4A is a simplified representation of the number of bins, such that FIG. 4A only shows seven bins 36 for each of the first and second ADC. In the example mentioned above, both the first and the second ADC 8a, 8b are 12-bit converters that have a maximum of 4096 bins, where the minimum number of bins is 0. If a portion of the signal is in one of the bins for a sample, the ADC will output the value associated with the bin. The 12-bit output of the ADC will represent the specific bin in which the signal appears.

A first signal range representation 45 and a second signal range representation 47 represent the ranges of the high gain signal and the low gain signal, respectively. For example, this range could be from 0 Volts or ground to a supply voltage of 3 Volts in the analog domain.

For the low gain signal 14, a central region 34 of the bins is associated with where the analog signal is considered flat or within a specified digital value range. In the digital domain, all variations in this central region 34 may or may not have the same value, depending on whether the central region 34 corresponds to one or a plurality of bins.

The central region is associated with a central upper threshold ($TH_{CentralUpper}$) and a central lower threshold ($TH_{CentralLower}$). The central region is the region of the output of the ADC that does not provide a useful signal in the digital domain for the low gain channel 14, i.e., the variations in amplitude in this region are not large enough to exceed the limits of the central region and thus appear flat. The signal in the central region is not utilized to determine the mapping parameters (i.e., is not selected as calibration samples). In one embodiment, limits of the central region 34 are determined by:

$$TH_{CentralUpper} = \text{Average} + \text{range}/nr \tag{4}$$

$$TH_{CentralLower} = \text{Average} - \text{range}/nr \tag{5}$$

The average is the signal average and may be represented by the maximum number of bins plus the minimum number of bins divided by 2. For example, with the 12-bit converters the signal average may be 1023. However, in other embodiments the signal average may not be the maximum plus the minimum divided by 2, as the average is typically dependent upon incoming signal parameters. It is to be noted that the signal average for the high and low gain channels may be different.

The range represents the range of the signal, maximum and minimum values of the amplitude. As the range grows, the limits of the central region also grow. The thresholds of the central region 34 are constantly being evaluated and adjusted (e.g., by signal analysis block 26) according to the parameters of the system. In particular, the parameters of the incoming signal may be changing and thus the thresholds will be changing. This allows the system to be constantly adjusting the area that represents poor quality signals to avoid utilizing samples of these poor quality signals as calibration samples used in the formation of the blended signal.

The variable nr is dependent on the parameters of the system and can be selected to optimize the size of the central region. For example, with a 12-bit ADC, nr may be set to 4. Some systems may opt to make the central region larger to avoid any potentially less optimal output signals. As the analog signal gets closer to the central region 34, the signal has a lower quality.

For the high gain signal, the signal range representation 45 includes an upper region 40 and a lower region 42 of the bins, and is associated with where the signal is considered to be saturated. The upper region is associated with an upper threshold ($TH_{Upper}$) and the lower region is associated with a lower threshold ($TH_{Lower}$). The upper region 40 may be referred to as overflow clipping while the lower region 42 may be referred to as underflow clipping. Any portion of the signal in or above the upper region or in or below the lower region may be distorted and thus is not utilized by the system as calibration samples to determine the mapping parameters. In addition, the high gain signal is not outputted by the system when it is clipped.

In one embodiment, the limits of the upper region 40 and the lower region 42 are respectively determined by the following:

$$TH_{upper} = \text{Maximum Bins} - nc \quad (6)$$

$$TH_{Lower} = \text{Minimum Bins} + nc \quad (7)$$

The maximum number of bins is determined by the number of bits of the ADC. For example, for the 12-bit ADC, the maximum number of bins is 4096 and the minimum number of bins would be zero. As with the variable nr, nc is dependent on the parameters of the system and can be selected to optimize the size of the upper and lower regions 40, 42. In one embodiment, with a 12-bit ADC, nc may be equal to 128.

Both the high gain signal and the low gain signal have high signal quality away from the upper and lower regions 40, 42 and away from the central region 34, respectively. As the high gain signal approaches the upper and lower regions 40, 42, the quality of the signal diminishes. Accordingly, the system selects a value for the variable nc that avoids utilizing the lower quality signal as the high gain signal approaches the upper and lower regions. The same is true for the central region 34 in that the low gain signal loses quality as it approaches the central region. The system selects a value for the variable nr to utilize the best portions of the signal when determining the mapping parameters used to generate the blended signal.

Figure 4B:
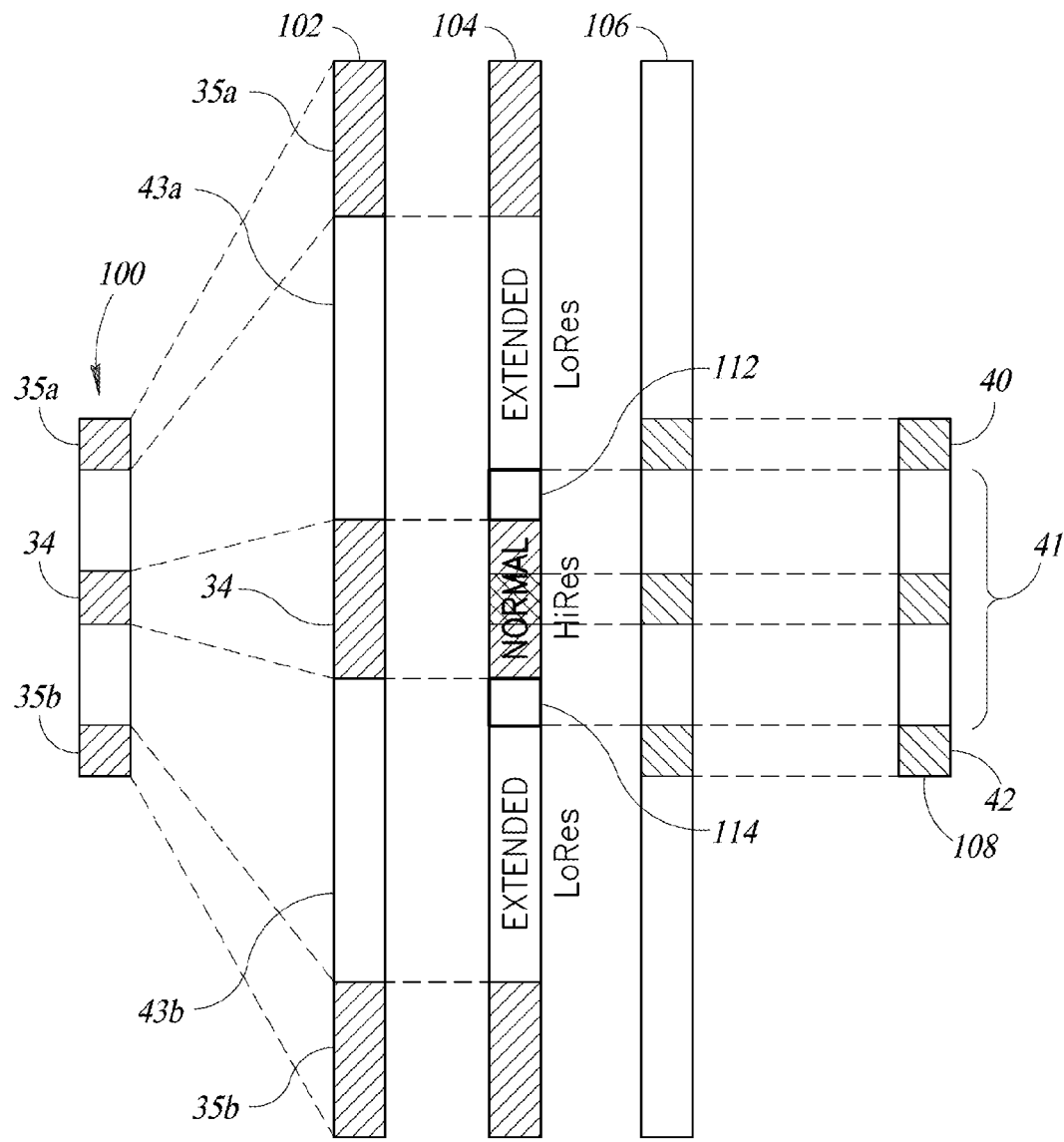

FIG. 4B provides an illustration of how auto-calibration is used to select calibration samples from the high and low gain signals after the limits or thresholds of the upper region, the lower region, and the central region are identified. In particular, FIG. 4B illustrates identification of overlapping resolution zones 112 and 114 from which calibration samples are selected.

A difference in amplification factors between the high and the low gain channels can be used in determining the auto calibration and identifying the overlapping resolution zone. For example, if the high gain channel amplifies the original signal by a factor of 10 and the low gain channel amplifies the original signal by a factor of 2, the difference in the amplification factors is 5. In particular, FIG. 4B includes a third signal range representation 100, a fourth signal range representation 102, a fifth signal range representation 104, a sixth signal range representation 106, and a seventh signal range representation 108.

The third signal range representation 100 represents the low gain signal. In particular, the third signal range representation 100 is generally analogous to the second signal range representation 47 and includes the central region 34. It is again emphasized that the central region 34 is not necessarily located in the center of the low gain signal range, but instead generally corresponds to an average position of the low gain signal.

The third signal range representation 100 further includes upper and lower limit regions 35a and 35b. Generally, low gain signal values included within the central region 34 should not be used because they represent a flat signal and have a low signal-to-noise ratio. Likewise, low gain signal values included within the upper limit region 35a or the lower limit region 35b are unreliable because they may include distortion. Therefore, low gain signal values included in such regions should not be selected as calibration samples for use in determining the mapping parameters.

The fourth signal range representation 102 represents an adjustment or expansion of the low gain range represented in the third signal range representation 100 so that it can be meaningfully compared to samples coming from the high gain channel. For example, representation 100 may be multiplied or otherwise expanded by the difference in amplification factors as discussed above. Alternatively, the most recently determined mapping parameters can be used to expand representation 100 into representation 102.

Thus, the fourth signal range representation 102 represents the low gain signal range scaled for comparison to the high gain signal range. The fourth signal range representation 102 includes the central region 34, the upper limit region 35a, and the lower limit region 35b, from which calibration sample should not be selected.

The fourth signal range representation 102 further includes a first extended low resolution zone 43a between the upper limit region 35a and the central region 34 and further includes a second extended low resolution zone 43b between the lower limit region 35b and the central region 34. The first and the second extended low resolution zones 43a and 43b represent portions of the low gain signal that are high quality or otherwise reliable.

The seventh signal range representation 108 represents the high gain signal. In particular, the seventh signal range representation 108 is generally analogous to the first signal range representation 45 and includes the upper region 40 and the lower region 42. As discussed above, any portion of the high gain signal in or above the upper region 40 or in or below the lower region may be distorted or otherwise clipped. Therefore, calibration samples should not be selected from such regions 40, 42.

The remaining portion of the seventh signal range representation 108 can be denominated as a normal high resolution zone 41. The normal high resolution zone 41 represents portions of the high gain signal that are high quality or otherwise reliable.

In some implementations, a central zone (not numerically called out) can be defined within the normal high resolution zone 41 by a process similar to that which identifies central region 34. In such implementations, high gain signal values included in the central zone may be ignored or otherwise not selected as they potentially correspond to a flat signal. However, as a practical matter, the expanded central region 34 will typically encompass any central zone defined within the normal high resolution zone 41. Therefore, due to the operation of central region 34, calibration samples will not be selected from the portion of normal high resolution zone 41 which corresponds to the average signal value.

The sixth signal range representation 106 is simply a representation of the high gain signal range (as represented by the seventh signal range representation 108) on the expanded scale associated with the fourth signal range representation 102. However, the regions 40, 41, and 42 are not themselves expanded. Thus, as a practical matter, the sixth signal range representation 106 is equivalent to the seventh signal range representation 108 with additional spacing shown for regions not included in the range of the high gain signal but that are included in the range of the low gain signal as expanded for comparison to the high gain signal.

The fifth signal range representation 104 is a combination of the fourth signal range representation 102 and the sixth signal range representation 106. In particular, the fifth signal range representation 104 identifies and includes two overlapping resolution zones 112 and 114. The first overlapping resolution zone 112 is the intersection of the first extended low resolution zone 43a and the normal high resolution zone 41. Likewise, the second overlapping resolution zone 114 is the intersection of the second extended low resolution zone 43b and the normal high resolution zone 41.

Thus, the overlapping resolution zones 112 and 114 define portions of the high gain and low gain signals that respectively represent high-quality and reliable values for such signals. Therefore, values of the high gain and low gain signals are particularly advantageous for use in determining the mapping parameters when the high gain and the low gain signals are concurrently present in either of the overlapping resolution zones 112 and 114.

As such, in some implementations of the present disclosure, the signal analysis block 26 can determine (e.g., on a per-sample basis) whether the high gain and low gain signals are concurrently present in either of the overlapping resolution zones 112 and 114. If it is determined that the signals are in one of the zones 112 and 114, then the values for such signals can be collected, stored, or otherwise selected for use as calibration samples. The selected calibration samples are then used to determine the mapping parameters.

Furthermore, as noted above, the various thresholds and regions shown in FIGS. 4A and 4B can be continuously updated or otherwise recalculated (e.g., on a per-sample basis). Therefore, the overlapping resolution zones 112 and 114 may be continuously changing and they represent a portion of the auto-calibration process in which selection of the calibration samples is continuously refined or otherwise impacted based on the current properties of the high gain and low gain signals.

In addition, as noted above, the auto-calibration is utilized to achieve a higher dynamic range with a smooth output signal in the system 10. Thus, in addition to guiding selection of the calibration samples, auto-calibration may also be used to assist in implementing an automatic transition from the high gain channel 16 to the blended signal 32 when the high gain channel 16 saturates. For example, in some implementations, a determination that the high gain and/or low gain signals are present in one or more of the particular regions shown in FIG. 4B may impact a selection of weightings used by the signal averaging block 24 to provide the output signal 18. As another example, by monitoring these overlap zones the system can detect if there is a likelihood that the high gain signal will saturate soon, ensuring that the transition is smooth and that no discontinuities can be detected in the output.

Having discussed one example process for selecting high-quality calibration samples, an example process for using calibration samples to determine mapping parameters will now be discussed with reference to FIG. 8.

In the digital domain, the high resolution signal corresponds to the high gain signal post analog-to-digital conversion and the low resolution signal corresponds to the low gain signal post analog-to-digital conversion. There is a linear relationship between the high resolution signal and the low resolution signal that corresponds to the linear relationship between the low gain signal and the high gain signal pre-analog-to-digital conversion. The high resolution signal will typically be the best quality signal except when the high resolution saturates or is otherwise too large.

In order to determine the mapping parameters, the signal analysis block 26 performs the least squares optimization mentioned above. The least squares optimization takes advantage of the linear relationship between the high gain signal and the low gain signal. In particular, the least squares optimization is performed based on the high resolution/low resolution relationship of the digital domain. In particular, one example formulation of the linear relationship between the high resolution and the low resolution signals can be represented generally by the following equation:

$$HiRes = LoRes * Gain + Offset \qquad (8)$$

The two unknowns of this equation are Gain and Offset. The least squares optimization is performed periodically or on a per-sample basis using data from a plurality of calibration samples N of the analog-to-digital converter.

Figure 8:
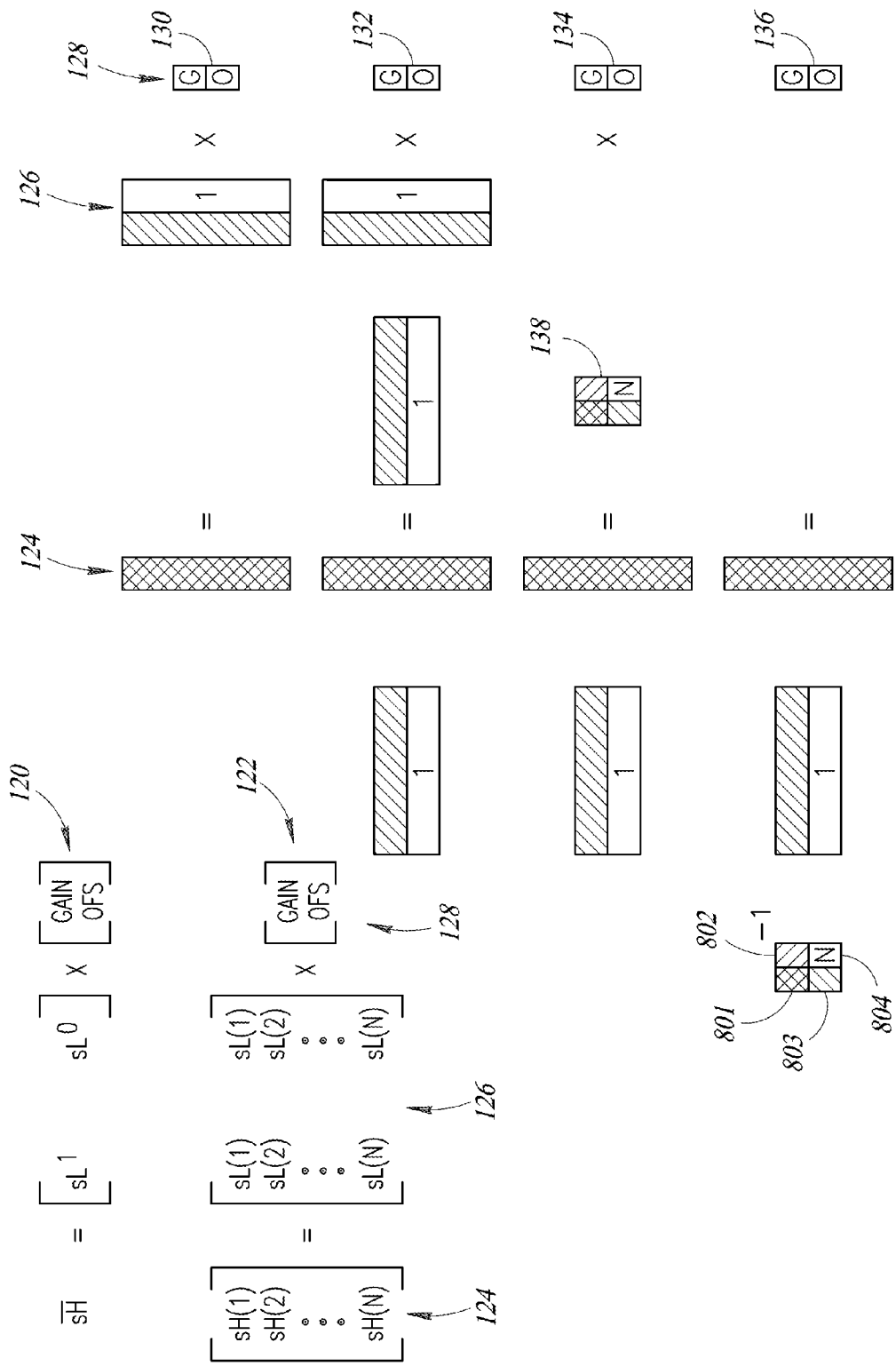
FIG. 8 is a representation of a least squares optimization for determining mapping parameters according to an example embodiment of the present disclosure.

FIG. 8 is an representation of how a least squares optimization can be utilized to determine the mapping parameters for this system, where $sH(x)$ represents the high resolution value per sample and $sL(x)$ represents the low resolution value per sample. The least square optimization is used to determine unknowns, i.e., the mapping parameters that are contained in the high gain and low gain signals.

Thus, the least squares optimization shown in FIG. 8 is a representation of one example scenario in which only two mapping parameters are solved for: gain and offset. However, any number of mapping parameters can be solved for using similar techniques. Therefore, in the first formula 120 shown in FIG. 8, there are two unknowns, gain and offset (Ofs). In other embodiments, there may be additional unknowns.

The linear relationship between the high resolution signal sH and the low resolution signal sL is represented by the equation 120. The low resolution signal has two matrix components, $sL^1$ and $sL^0$, represented by a 1 by 2 matrix. Generally, sL raised to the zero power equals one. In order to map the low resolution signal to the high resolution signal, the low resolution signal matrix is multiplied by a matrix of gain and offset. The gain and the offset are represented by a 2 by 1 matrix.

The signal processing circuitry 12 is configured to utilize this relationship to determine the mapping parameters, like gain and offset, after the two signals have passed through the amplification stage. Once the gain and the offset are determined, the system forms the blended signal from the low gain signal and the determined mapping parameters.

The mapping parameters can be continually processed and generated by the system by processing a set of calibration samples. Alternatively, the system could intermittently determine the mapping parameters, such as when a change in the signal range is detected.

A second equation 122 in FIG. 8 represents a more complex relationship between the high resolution and the low resolution signals. In particular, a high resolution matrix 124, that is N by 1, represents a number of high resolution outputs per N calibration samples of the analog-to-digital converter. A low resolution matrix 126 is an N by 2 matrix that includes the low resolution outputs per the N calibration samples. Thus, in some implementations, only high-quality calibration samples are used to fill or otherwise populate the matrices 124 and 126.

The low resolution matrix 126 is multiplied by a mapping parameters matrix 128 that is a 2 by 1 matrix. The mapping parameters shown in the mapping parameters matrix 128 are gain and offset; however, as noted above, a larger number and type of mapping parameters may be determined by the system depending on the complexity of the analysis. There are many parameters in the linear relationship between the high gain and low gain channels and the number of parameters selected for detection can change.

A series of equations 130, 132, 134, 136 are pictorially represented in FIG. 8. These equations can easily be implemented in software to process the data from this system to generate the mapping parameters. Alternatively, in some implementations, only the final equation 136 is implemented in software at each instance of mapping parameter determination.

In line with the linear relationship of the high resolution matrix 124 and the low resolution matrix 126, the first equation 130 includes an N by 1 matrix that includes N high resolution calibration samples. The first equation 130 includes an N by 2 matrix that represents the low resolution matrix 126. The low resolution matrix 126 is multiplied by a 2 by 1 matrix of the mapping parameters, the unknowns, in equations 122 and 130. A left-most column of the low gain matrix 126 may represent N low gain samples while the right-most column may represent the zeroth power of the signal (e.g., N matrix entries of 1).

To solve for the unknowns, the system multiplies both sides of the first equation 130 with a 2 by N matrix that is a transpose of matrix 126, see the second equation 132. Through the multiplication of the low resolution matrix 126 (N by 2) by the transpose of the matrix, i.e., a 2 by N matrix, a square matrix 138 is generated. The square matrix 138 is generated so that the inverse of the square matrix 138 may be utilized to solve for the mapping parameters 128, see equation 136.

The square matrix 138 includes a sum of the calibration samples from the low gain channel in both of a lower left cell 803 and an upper right cell 802. The upper left cell 801 of the square matrix 138 represents a sum of each of the calibration samples from the low gain channel squared by itself. The lower right cell 804 includes a value equal to the number of calibration samples N.

The values included in cells may be denominated as accumulator values and may be recalculated or otherwise updated for each new calibration sample. For example, the accumulator value in each of cells 801-804 can be updated as follows:

$$\text{Accumulator}_{801}(n) = \text{Accumulator}_{801}(n-1) + sL(n)^2 \qquad (9)$$

$$\text{Accumulator}_{802}(n) = \text{Accumulator}_{802}(n-1) + sL(n) \qquad (10)$$

$$\text{Accumulator}_{803}(n) = \text{Accumulator}_{803}(n-1) + sL(n) \qquad (11)$$

$$\text{Accumulator}_{804}(n) = \text{Accumulator}_{804}(n-1) + 1 \qquad (12)$$

With respect to the two other matrices on the left-hand side of equation 136, such matrices represent a horizontal rectangular matrix made of powers of low gain calibration samples with the top row being $1^{st}$ powers and the bottom row is being $0^{th}$ powers (i.e., 1)) multiplied with a vertical rectangular matrix made of high gain calibration samples. Such matrix multiplication (a 2×N matrix multiplied by a 1×N matrix) results in a 2×1 matrix that can be maintained with two additional accumulator values, as follows:

$$\text{Accumulator}_5(n) = \text{Accumulator}_5(n-1) + sL(n)*sH(n) \qquad (13)$$

$$\text{Accumulator}_6(n) = \text{Accumulator}_6(n-1) + sH(n) \qquad (13)$$

The matrices on the left-hand side of equation 136 may be updated at each incoming sample from the analog-to-digital converter (e.g., through update of the accumulator values). The inversion shown in the fourth equation 136 (i.e., resolution of the equation 136) may be performed for each N calibration samples, especially when the system is well conditioned, or may be performed on a per-sample basis. Using the least square optimization allows the system to process thousands of data points while only having to store information about 8 numbers, the six accumulators and the determined mapping parameters, gain and offset. In some implementations, the accumulator values are never or only infrequently reset. In other implementations, the accumulator values are periodically reset or returned to zero. In yet other implementations, a moving window of N calibration values are used.

The system can easily solve for the mapping parameters using the least squares optimization. This technique is beneficial because only basic matrix operations are needed to solve for the mapping parameters. Once determined, the mapping parameters are provided to the signal mapping block 28 in FIG. 2 to generate the blended signal 32. The signal mapping block 28 is configured to remap or merge the low gain signal 14 with the parameters detected. For example, the signal mapping block 28 may execute the following formula where L' is the blended or modified output signal 32 and L is the low gain signal 14.

$$L' = K(0) + K(1)*L^1 + \ldots + K(M)*L^M \qquad (14)$$

FIG. 5 is directed to a high dynamic range system 51 according to an alternative embodiment of the present disclosure that is configured to receive an input signal 50 such as analog signals representing sound or rotations, in a transducer assembly 49. The transducer assembly 49 includes four sensors 60, 62, 64, 66, each having a different sensitivity. The dynamic range of the system can be increased by including more transducers. In other implementations, the transducer assembly 49 is an apparent multichannel transducers rather than a true multichannel transducer, as shown.

A first sensor 60 is coupled to a first processing circuit 70 and outputs a first channel 80. A second sensor 62 is coupled to a second processing circuit 72 and outputs a second channel 82. A third sensor 64 is coupled to a third processing circuit 74 and outputs a third channel 84. A fourth sensor 66 is coupled to a fourth processing circuit 76 and outputs a fourth channel 86. Since each of the sensors is a different sensitivity, each of the processing circuits will apply a different gain to provide four simultaneously acquired channels to be processed by the signal processing stage 53.

As mentioned above, the difficulty arises with transitioning between the different channels associated with the multiple transducers. This system 51 is configured to smoothly transition between the four different channels to produce an output signal 58 that includes minimal discontinuities.

In one embodiment, the first sensor 60 may be an extremely sensitive sensor that is configured to detect very weak signals. The second sensor 62 may also be a sensitive sensor that is configured to detect weak signals in a different frequency range from the first sensor 60. Since both the first and second sensor 60, 62 are configured to detect weak signals, the first and second processing circuits 70, 72 may apply a higher gain to amplify the weak signals and output the first channel 80 and the second channel 82, which are a highest gain channel and a high gain channel, respectively.

The third sensor 64 may be a sensor configured to detect stronger signals and the fourth sensor 66 may be configured to detect a signal stronger than the third sensor. The third and fourth processing circuits 74, 76 are configured to process the stronger signals and provide appropriate amplification for the strength of the received signals. The third processing circuit is configured to output the third channel 84, which is a low gain signal. The fourth processing circuit is configured to output the fourth channel 86, which is a lowest gain signal of this system 51.

The signal processing stage 53 includes a first signal analysis and averaging block 90 that is coupled to the first channel 80 and to the second channel 82. The signal processing stage 53 also includes a second signal analysis and averaging block 92 that is coupled to the third channel 84 and to the fourth channel 86. The operation of the first and second signal analysis and averaging blocks is described in more detail with respect to FIG. 6.

The first signal analysis and averaging block 90 outputs a first intermediate signal 94 that is a blended version of the first channel 80 and the second channel 82. The second signal analysis and averaging block 92 outputs a second intermediate signal 96 that is a blended version of the third channel 84 and the fourth channel 86.

A third signal analysis and averaging block 98 receives the first intermediate signal 94 and the second intermediate signal 96 and provides the output signal 58. As can be seen in more detail in FIG. 6, the third signal analysis and averaging block 98 will output the first intermediate signal 94 unless it is saturated or clipped. If the first intermediate signal 94 is clipped, then the third signal analysis and averaging block 98 will output a blended signal 58.

Figure 6:
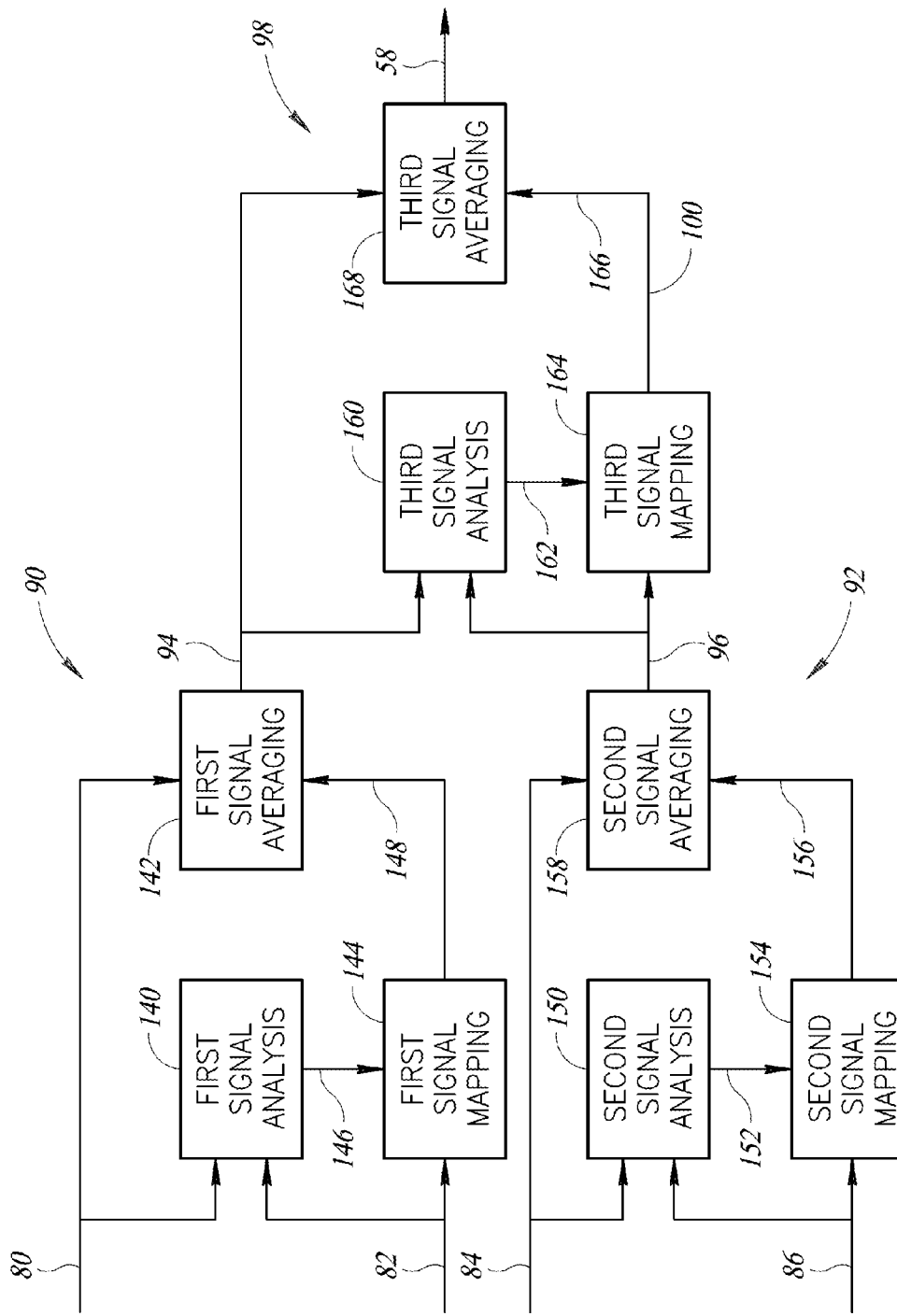
FIG. 6 is an enhanced block diagram of the signal processing stage of FIG. 5.

In FIG. 6, the first, second, and third signal analysis and averaging blocks 90, 92, 98 are provided in more detail. Each of the signal analysis and averaging blocks includes a signal analysis block, a signal mapping block, and a signal averaging block. Each of the signal analysis and averaging blocks may mirror the signal processing block 12 of FIGS. 1A, 1B, and 2.

In particular, the first signal analysis and averaging block 90 includes a first signal analysis block 140 that receives the first channel 80 and the second channel 82. As noted above, the first channel 80 is the highest gain channel and the second channel 82 is the intermediate high gain signal. The first signal analysis block 140 outputs a first set of mapping parameters 146. A first signal mapping block 144 receives the second channel 82 and the first set of mapping parameters 146. The first signal mapping block 144 outputs a first blended signal 148. A first signal averaging block 142 receives the first channel 80 and the blended signal 148 and outputs a first high gain intermediate signal 94. As described above, the first signal averaging block 142 will output a weighted average of the first channel 80 and the blended signal 148. As one example, the signal averaging block 142 will output the first channel 80 unless the first channel is saturated. If the first channel is saturated, then the first signal averaging block 142 will output the blended signal.

The second signal analysis and averaging block 92 includes a second signal analysis block 150 that receives the third channel 84 and the fourth channel 86. As noted above, the third channel 84 is the intermediate low gain channel and the fourth channel 86 is the lowest gain signal. The second signal analysis block 150 outputs a second set of mapping parameters 152. A second signal mapping block 154 receives the fourth channel 86 and the second set of mapping parameters 152. The second signal mapping block 154 outputs a second blended signal 156. A second signal averaging block 158 receives the third channel 84 and the second blended signal 156 and outputs the second low gain intermediate signal 96. As described above, the second signal averaging block 158 will output a weighted average of the third channel 84 and the second blended signal 156. As one example, the second signal averaging block 158 will output the third channel 84 unless the third channel is saturated. If the third channel is saturated, then the second signal averaging block 158 will output the second blended signal 156.

The third signal analysis and averaging block 98 includes a third signal analysis block 160 that receives the first intermediate signal 94 and the second intermediate signal 96. The third signal analysis block 160 outputs a third set of mapping parameters 162. A third signal mapping block 164 receives the second intermediate signal 96 and the third set of mapping parameters 162. The third signal mapping block 164 outputs a third blended signal 166. A third signal averaging block 168 receives the first intermediate signal 94 and the third blended signal 166. The third signal averaging block 168 will output a weighted average of the first intermediate signal 94 and the third blended signal 166. As one example, the third signal averaging block 168 will output the first intermediate high gain signal 94 unless the first intermediate high gain signal 94 is saturated. If the first intermediate high gain signal 94 is saturated, then the third signal averaging block 168 will output the third blended signal 156.

There are instances where it is possible for both the highest gain signal and the high gain signal, the first channel and the second channel, to be saturated, such that the system would output the third intermediate signal, which is derived from the low gain and lowest gain signals. This dramatically increases the dynamic range available in such systems, while providing for a method to produce a smooth output signal.

Figure 7:
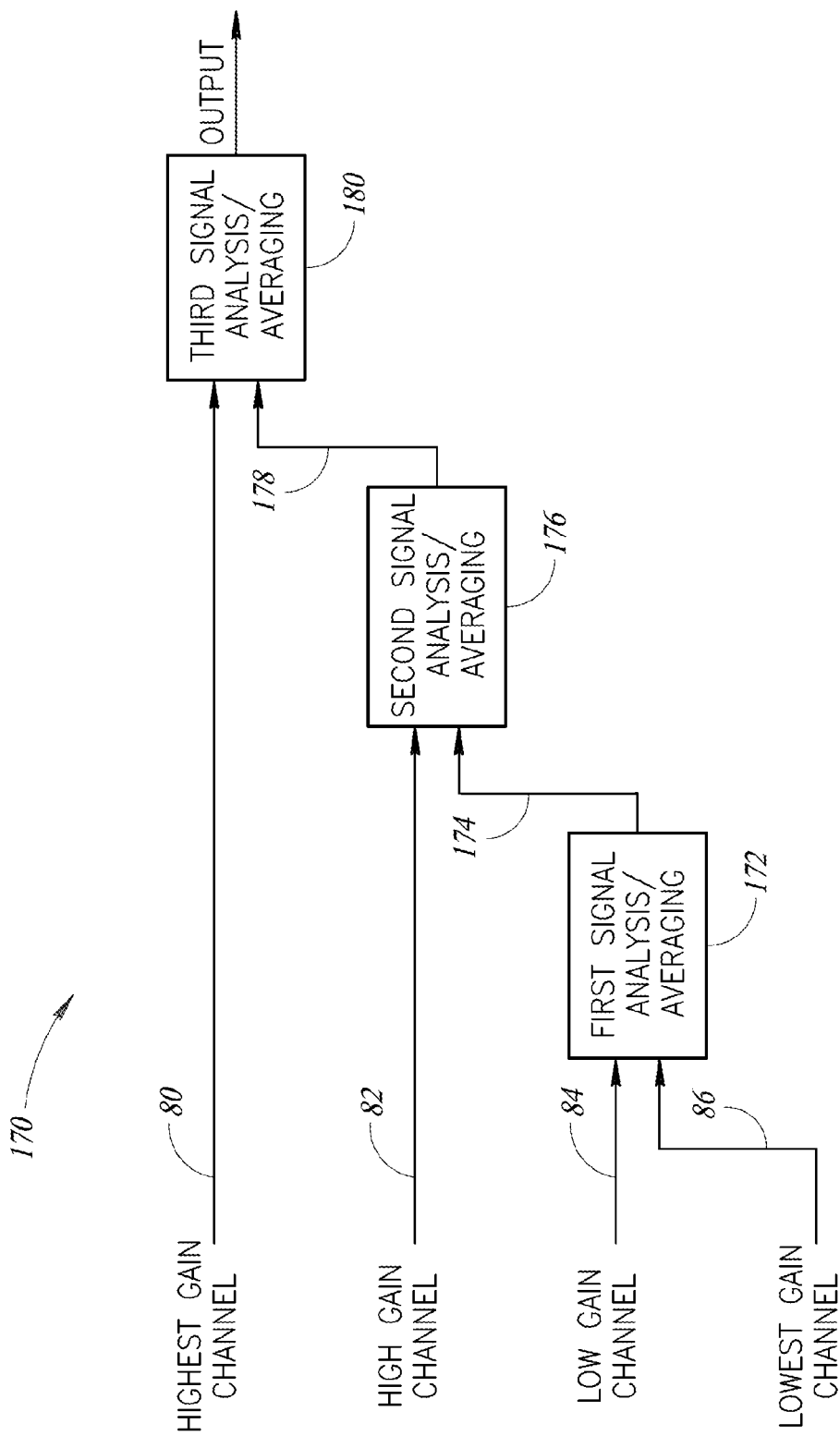
FIG. 7 is a block diagram of a transducer assembly a signal processing stage that performs sequential processing according to an example embodiment of the present disclosure.

The processing arrangement of FIGS. 5 and 6 is parallel processing of the first, second, third, and fourth channels. FIG. 7 is an alternative embodiment of a processing stage with multiple input channels. FIG. 7 is a sequential processing stage 170 that is configured to sequentially process the first channel 80, the second channel 82, the third channel 84, and the fourth channel 86.

The sequential processing stage 170 includes a first signal analysis and averaging block 172 that receives the fourth channel 86 and the third channel 84. The fourth channel 86 being the channel that has the lowest amplification factor or sensitivity and the third channel 84 being the channel that has the intermediate low amplification factor or sensitivity. As described with respect to FIGS. 5 and 6, the first signal analysis and averaging block 172 is configured to generate mapping parameters based on the third and fourth channels and is configured to generate a blended signal from the mapping parameters and the fourth channel. The first signal analysis block outputs a first intermediate signal 174 that is a weighted average of the third channel 84 and the blended signal.

The sequential processing stage 170 includes a second signal analysis and averaging block 176 that receives the first intermediate signal 174 and the second channel 82, which is the intermediate high gain signal. As described with respect to FIGS. 5 and 6, the second signal analysis and averaging block 176 is configured to generate mapping parameters based on the first intermediate signal 174 and the second channel. The second signal analysis and averaging block 176 is configured to generate a blended signal from the mapping parameters and the second channel 82. The second signal analysis block 176 outputs a second intermediate signal 178 that is a weighted average of the second channel 84 and the blended signal.

The sequential processing stage 170 includes a third signal analysis and averaging block 180 that receives the first channel 80 and the second intermediate signal 178. As described with respect to FIGS. 5 and 6, the third signal analysis and averaging block 176 is configured to generate mapping parameters based on the second intermediate signal 178 and the first channel 80. The third signal analysis and averaging block 180 is configured to generate a blended signal from the mapping parameters and the second intermediate signal 178. The third signal analysis block 178 outputs either the first channel 80 or the blended signal if the first channel is saturated.

The sequential processing stage 170 may take longer to process than the parallel processing stage of FIGS. 5 and 6, for example due to latency in the computation. One benefit of the sequential processing stage 170 is that the first, second, and third signal analysis and averaging blocks may be implemented with a single module. The outputs of the first processing of the third and fourth channel may be stored in memory and provided back to the same module to perform the next analysis. The sequential processing stage 170 may be implemented in software. The parallel processing stage of FIGS. 5 and 6 may also be implemented in software, however, the parallel processing stage may operate more quickly if implemented in hardware.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application No. 61/972,194, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
receiving a first signal from a first acquisition channel having a first sensitivity;
receiving a second signal from a second acquisition channel having a second sensitivity that is different from the first sensitivity;
generating a blended signal by mapping the second signal to the first signal;
outputting the first signal while the first signal is below a first threshold and above a second threshold; and
outputting the blended signal when the first signal is above the first threshold and when the first signal is below the second threshold.

2. The method of claim 1 wherein generating the blended signal includes:
detecting a plurality of mapping parameters from the first signal and the second signal; and
forming the blended signal by modifying the second signal with the mapping parameters.

3. The method of claim 2 wherein detecting the plurality of mapping parameters includes performing a least squares optimization on the first signal and the second signal.

4. The method of claim 1, further comprising:
receiving a third signal from a third acquisition channel;
receiving a fourth signal from a fourth acquisition channel; and
generating the blended signal by mapping the first signal, the second signal, the third signal, and the fourth signal.

5. The method of claim 4 wherein generating the blended signal includes:
forming a first intermediate signal by mapping the second signal to the first signal;
forming a second intermediate signal by mapping the fourth signal to the third signal; and
forming the blended signal by mapping the second intermediate signal to the first intermediate signal.

6. The method of claim 4 wherein generating the blended signal includes:
forming a first intermediate signal by mapping the fourth signal to the third signal;
forming a second intermediate signal by mapping the first intermediate signal to the second signal; and
forming the blended signal by mapping the second intermediate signal to the first signal.

7. The method of claim 1 wherein receiving the first signal and receiving the second signal includes:
receiving the first signal from a first analog-to-digital converter; and
receiving the second signal from a second analog-to-digital converter.

8. The method of claim 7, further comprising determining the first threshold and the second threshold by analyzing a second plurality of quantization levels of the second analog-to-digital converter.

9. The method of claim 7 wherein the first signal is a high gain signal and the second signal is a low gain signal.

10. The method of claim 9, further comprising:
determining a third threshold and a fourth threshold of the low gain signal by analyzing a first plurality of quantization levels of the first analog-to-digital converter; and
determining the first threshold and the second threshold by analyzing a second plurality of quantization levels of the second analog-to-digital converter.

11. The method of claim 10, further comprising:
determining a high resolution zone from the first threshold and the second threshold;
determining a low resolution zone from the third threshold and the fourth threshold; and
determining an overlapping region of the high resolution zone and the low resolution zone.

12. The method of claim 11, further comprising utilizing the overlapping region to identify a plurality of calibration samples usable in determining a plurality of mapping parameters.

13. A device, comprising:
a first sensor having a first sensitivity;
a second sensor having a second sensitivity;
a first analog-to-digital converter coupled to the first sensor;
a second analog-to-digital converter coupled to the second sensor; and
a signal processing stage coupled to the first analog-to-digital converter and to the second analog-to-digital converter, the signal processing stage including:
a first signal analysis block coupled to the first analog-to-digital converter and to the second analog-to-digital converter;
a first signal mapping block coupled to the second analog-to-digital converter and to the first signal analysis block; and
a first signal averaging block coupled to the first analog-to-digital converter and to the first signal mapping block.

14. The device of claim 13, further comprising:
a third sensor;
a fourth sensor;

a third analog-to-digital converter; and
a fourth analog-to-digital converter.

15. The device of claim 14 wherein the signal processing stage includes:
   a second signal analysis block coupled to the third analog-to-digital converter and to the fourth analog-to-digital converter;
   a second signal mapping block coupled to the fourth analog-to-digital converter and to the second signal analysis block; and
   a second signal averaging block coupled to the third analog-to-digital converter and to the second signal mapping block.

16. The device of claim 15 wherein the signal processing stage includes:
   a third signal analysis block coupled to the first signal averaging block and to the second signal averaging block;
   a third signal mapping block coupled to the second signal averaging block and to the third signal analysis block; and
   a third signal averaging block coupled to the first signal averaging block and to the third signal mapping block.

17. A device, comprising:
   a low gain acquisition module that provides a low gain signal;
   a high gain acquisition module that provides a high gain signal; and
   a signal processing stage configured to:
      determine a plurality of mapping parameters that describe a linear relationship between the low gain signal and the high gain signal;
      form a blended signal based at least in part on the low gain signal and the plurality of mapping parameters, the blended signal representative of the low gain signal mapped onto the high gain signal; and
      provide an output signal that is a weighted average of the high gain signal and the blended signal.

18. The device of claim 17 wherein to determine the plurality of mapping parameters the signal processing stage is configured to select a first plurality of calibration samples of the low gain signal and a second plurality of calibration samples of the high gain signal, the first and the second plurality of calibration samples respectively corresponding to values of the low gain signal and the high gain signal when the low gain signal and the high gain signal are concurrently in an overlapping resolution zone.

19. The device of claim 18 wherein to determine the plurality of mapping parameters the signal processing stage is further configured to perform a least squares optimization with respect to the first and the second pluralities of calibration samples, the least squares optimization including updating a square matrix that includes at least a first cell that holds a first accumulator value equal to a summation of squares of the first plurality of calibration samples.

20. The device of claim 17 wherein the signal processing stage is configured to determine the plurality of mapping parameters and form the blended signal on a per-sample basis.

21. The device of claim 17 wherein to provide the output signal the signal processing stage is configured to:
   select a first signal weight for the high gain signal and a second signal weight for the blended signal; and
   determine the weighted average of the high gain signal and the blended signal based at least in part on the first signal weight and the second signal weight.

22. The device of claim 21 wherein to select the first signal weight and the second signal weight the signal processing stage is configured to compare the high gain signal to a first threshold value and a second threshold value, the first and the second threshold values representative of limits of a saturated signal range associated with the high gain signal.

23. The device of claim 22 wherein the signal processing stage is further configured to re-determine the first and the second threshold values on a per-sample basis.

24. The device of claim 22 wherein signal processing stage is configured to:
   select one as the first signal weight and select zero as the second signal weight when the high gain signal is between the first and the second threshold values; and
   select zero as the first signal weight and select one as the second signal weight when the high gain signal is not between the first and the second threshold values.

25. The device of claim 22 wherein:
   to select the first signal weight and the second signal weight the signal processing stage is further configured to compare the low gain signal to a third threshold value and a fourth threshold value, the third and the fourth threshold values representative of limits of a flat signal range associated with the low gain signal.
   the signal processing stage is configured to select non-zero values for each of the first signal weight and the second signal weight when the high gain signal is between the first and the second threshold values and the low gain signal is not between the third and the fourth threshold values.

* * * * *